(12) United States Patent
Kim et al.

(10) Patent No.: US 11,425,846 B2
(45) Date of Patent: Aug. 23, 2022

(54) ELECTRIC POWER SOURCE DEVICE (71) Applicant: DENSO CORPORATION, Kariya (JP)

(72) Inventors: Kwan Ryul Kim, Kariya (JP); Shotaro Yamasaki, Kariya (JP)

(73) Assignee: DENSO CORPORATION, Kariya (JP)

( * ) Notice: Subject to any disclaimer, the term of this patent is extended or adjusted under 35 U.S.C. 154(b) by 290 days.

(21) Appl. No.: 16/744,904

(22) Filed: Jan. 16, 2020

(65) Prior Publication Data
US 2020/0245493 A1    Jul. 30, 2020

(30) Foreign Application Priority Data

Jan. 29, 2019  (JP) .............................. JP2019-013033

(51) Int. Cl.
| | |
|---|---|
| *H05K 7/20* | (2006.01) |
| *H02M 3/335* | (2006.01) |
| *H01F 27/28* | (2006.01) |
| *H01L 25/16* | (2006.01) |
| *H01L 27/02* | (2006.01) |
| *H01L 23/367* | (2006.01) |
| *H01F 27/02* | (2006.01) |

(52) U.S. Cl.
CPC ........... *H05K 7/209* (2013.01); *H01F 27/025* (2013.01); *H01F 27/28* (2013.01); *H01L 23/3675* (2013.01); *H01L 25/165* (2013.01); *H02M 3/33576* (2013.01); *H05K 7/20418* (2013.01)

(58) Field of Classification Search
CPC .. H05K 3/0061; H05K 1/0203; H05K 7/2089; H05K 7/209; H05K 7/2039; H05K 7/20418; H01F 27/24; H01F 27/28; H01F 17/0013; H01F 27/22; H01F 7/081; H01F 27/025; Y10T 29/4913; H01L 23/3675; H01L 25/165; H02M 3/33576

See application file for complete search history.

(56) References Cited

U.S. PATENT DOCUMENTS

| | | | |
|---|---|---|---|
| 6,124,778 A * | 9/2000 | Rowley | H01F 17/0013 336/200 |
| 6,549,409 B1 * | 4/2003 | Saxelby, Jr | H05K 1/0203 361/704 |

(Continued)

FOREIGN PATENT DOCUMENTS

JP    2014-074567 A    4/2014

*Primary Examiner* — Michael A Matey
(74) *Attorney, Agent, or Firm* — Oliff PLC (57) ABSTRACT

A DC-DC converter as an electric power source device has a magnetic component, a semiconductor component, a circuit substrate and a thermal conductive component. The magnetic component has a thermal energy discharge surface. The semiconductor component is electrically connected to the magnetic component. A controller arranged on the circuit substrate is electrically connected to the semiconductor component to control behavior of the semiconductor component. The thermal conductive component is arranged in a thickness direction of the circuit substrate to be overlapped with the magnetic component. The thermal conductive component is arranged, without being electrically connected with the semiconductor component and the circuit substrate, to face the thermal energy discharge surface of the magnetic component to allow thermal energy generated in the magnetic component to be conducted with the thermal conductive component.

12 Claims, 5 Drawing Sheets

(56) References Cited

U.S. PATENT DOCUMENTS

| | | | |
|---|---|---|---|
| 2002/0003715 A1* | 1/2002 | Matsumoto | H01F 27/2804 363/147 |
| 2005/0161809 A1* | 7/2005 | Nakatsu | H02M 7/003 257/734 |
| 2005/0189566 A1* | 9/2005 | Matsumoto | H02M 3/33538 257/200 |
| 2011/0018374 A1* | 1/2011 | Yamasaki | H01L 23/36 310/64 |
| 2011/0228507 A1* | 9/2011 | Yin | H01L 23/49531 361/811 |
| 2011/0285223 A1* | 11/2011 | Miyachi | H02K 11/33 310/64 |
| 2012/0098391 A1* | 4/2012 | Yamasaki | H02K 3/50 310/68 D |
| 2012/0112866 A1* | 5/2012 | Matsumoto | H01F 27/22 336/61 |
| 2014/0225482 A1* | 8/2014 | Hara | H05K 7/20509 310/68 D |
| 2014/0233281 A1* | 8/2014 | Goto | H02M 7/003 363/39 |
| 2014/0233282 A1* | 8/2014 | Ohoka | H02M 1/14 363/39 |
| 2015/0036388 A1* | 2/2015 | Handa | H02M 1/44 363/15 |
| 2015/0123645 A1* | 5/2015 | Takemoto | H02M 3/28 323/355 |
| 2017/0033702 A1* | 2/2017 | Kurauchi | H02M 3/33569 |
| 2018/0295755 A1* | 10/2018 | Lin | H05K 7/1492 |
| 2018/0332731 A1* | 11/2018 | Kita | H01F 27/025 |
| 2018/0367031 A1* | 12/2018 | Ando | H02M 3/33584 |
| 2019/0206810 A1* | 7/2019 | Kanai | H05B 6/06 |
| 2021/0321527 A1* | 10/2021 | Ma | H05K 1/0206 |
| 2021/0345518 A1* | 11/2021 | Takahashi | B32B 37/24 |

* cited by examiner

ELECTRIC POWER SOURCE DEVICE

CROSS-REFERENCE TO RELATED APPLICATION

This application is related to and claims priority from Japanese Patent Application No. 2019-13033 filed on Jan. 29, 2019, the contents of which are hereby incorporated by reference.

TECHNICAL FIELD

The present disclosure relates to electric power source devices.

BACKGROUND

An electric power source device has a plurality of magnetic units, a plurality of semiconductor units, a circuit substrate and one or more connection members having a plate shape. The plurality of magnetic units are electrically connected to the plurality of respective semiconductor units. One or more controllers are mounted on the circuit substrate so as to control behavior of the semiconductor units. The plate shaped connection members are arranged between the magnetic units and the circuit substrate.

The connection members in the electric power source device previously described form electrical connections between the plurality of semiconductor units, and/or form electrical connections between the semiconductor units and the controllers arranged on the circuit substrate. As previously described, electric power is supplied to the semiconductor units through the connection members.

Because the connection members are arranged facing the plurality of magnetic units in the electric power source device, this arrangement allows thermal energy generated in the plurality of magnetic units to be conducted to the other components such as the plurality of semiconductor units previously described through the electrical connections. Although the connection members have a specific thermal energy discharging capability, this thermal energy discharging capability is limited when being necessary to reduce a thickness of the connection members according to structural requirements. That is, the reduction in thickness of the connection members prevents the thermal energy discharging performance of the connection members from being maintained. That is, such increasing in electrical conductive performance of the connection members causes a difficulty of maintaining the required thermal energy discharging performance of the magnetic units in the electric power source device previously described. From the viewpoint of the thermal energy discharging performance of the magnetic units, this drawback easily occurs in the electric power source device for providing a high power voltage.

SUMMARY

It is desired for the present disclosure to provide an electric power source device having a magnetic component, a semiconductor component electrically connected to the magnetic component, a circuit substrate and a thermal conductive component. The thermal conductive component is arranged in a thickness direction of the circuit substrate to be overlapped with the magnetic component. The thermal conductive component is arranged, without electrically connected with the semiconductor component or the circuit substrate, to face a thermal energy discharge surface of the magnetic component to allow thermal energy generated in the magnetic component to be conducted with the thermal conductive component.

BRIEF DESCRIPTION OF THE DRAWINGS

A preferred, non-limiting embodiment of the present disclosure will be described by way of example with reference to the accompanying drawings, in which.

DETAILED DESCRIPTION OF THE PREFERRED EMBODIMENTS

Hereinafter, various embodiments of the present disclosure will be described with reference to the accompanying drawings. In the following description of the various embodiments, like reference characters or numerals designate like or equivalent component parts throughout the several diagrams.

First Exemplary Embodiment

A description will be given of an electric power source device according to a first exemplary embodiment of the present disclosure with reference to FIG. 1 to FIG. 4.

Figure 1:
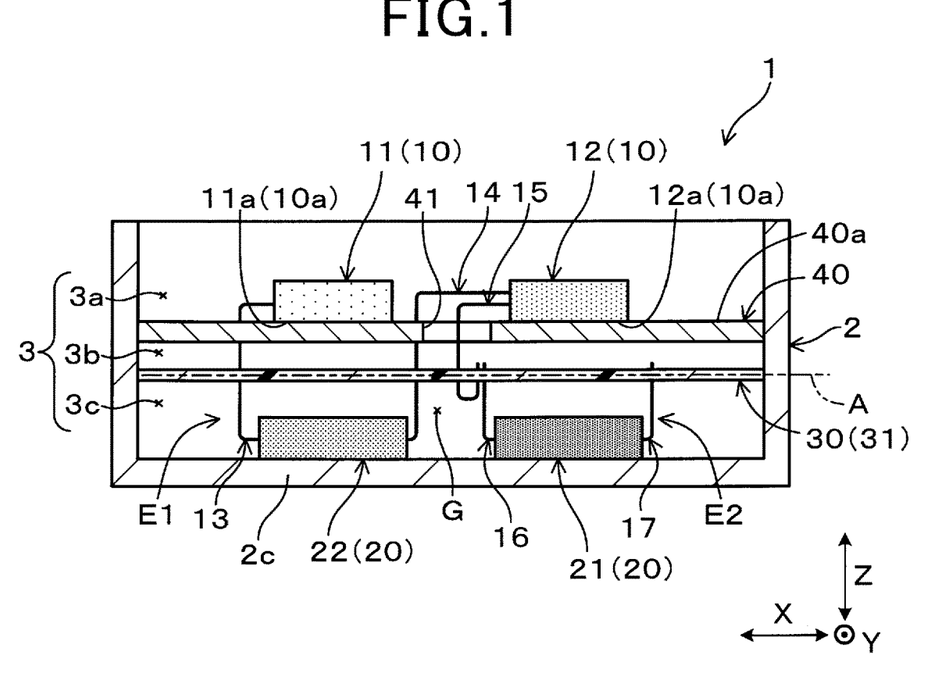
FIG. 1 is a view showing a cross section of a DC-DC converter as an electric power source device according to a first exemplary embodiment of the present disclosure.

FIG. 1 is a view showing a cross section of a direct current to direct current converter (DC-DC converter) 1 as the electric power source device according to the first exemplary embodiment. As shown in FIG. 1, the DC-DC converter 1 performs a voltage step-down control of reducing a high DC voltage of a DC power source to a low DC voltage, and of supplying the low DC voltage to an auxiliary battery.

Figure 2:
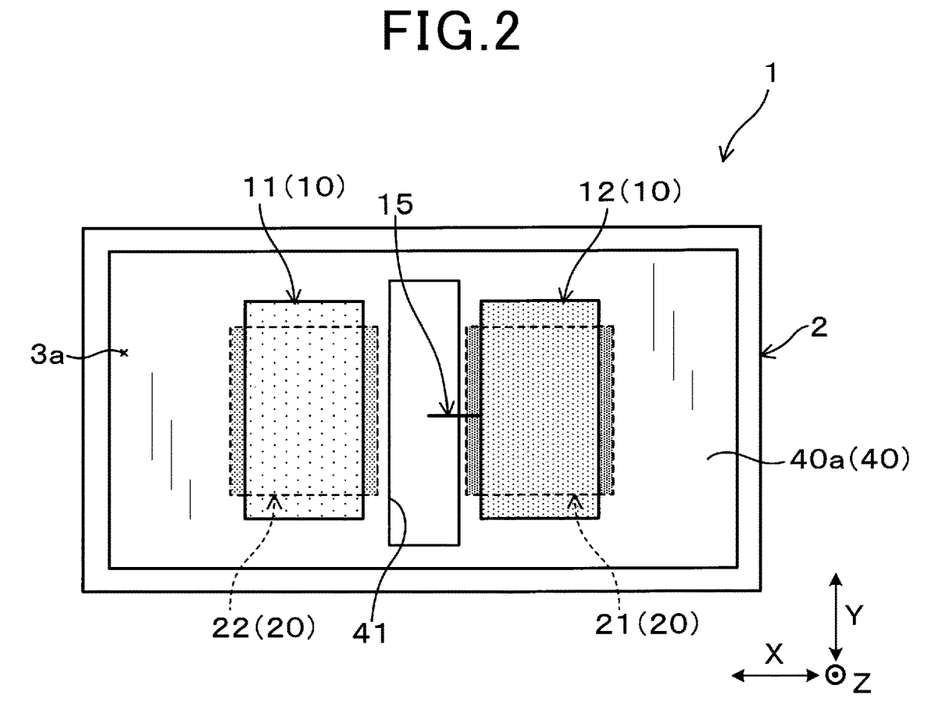
FIG. 2 is a plan view of the DC-DC converter as the electric power source device according to the first exemplary embodiment shown in FIG. 1.

FIG. 2 is a plan view of the DC-DC converter 1 as the electric power source device according to the first exemplary embodiment shown in FIG. 1. As shown in FIG. 1 and FIG. 2, the DC-DC converter 1 has a casing 2, a magnetic component 10, a semiconductor component 20, a circuit substrate 30 and a first thermal conductive part 40 as a thermal conductive component. The magnetic component 10 is composed of a first magnetic unit 11 and a second magnetic unit 12.

The semiconductor component 20 is composed of a primary side semiconductor unit 21 and a secondary side semiconductor unit 22. The magnetic component 10 is electrically connected to the semiconductor component 20.

The casing 2 has a box shape with a bottom part 2c, and accommodates the magnetic component 10 composed of the first magnetic unit 11 and the second magnetic unit 12, the semiconductor component 20 composed of the primary side semiconductor unit 21 and the secondary side semiconductor unit 22, the circuit substrate 30 and the first thermal conductive part 40. The primary side semiconductor unit 21 and the secondary side semiconductor unit 22 in the semiconductor component 20 are thermally connected to an inner wall surface of the bottom part 2c of the casing 2 so as to discharge thermal energy generated in the primary side semiconductor unit 21 and the secondary side semiconductor unit 22 to the outside of the casing 2. It is preferable to form the casing 2 by metal member having a superior thermal conductivity so as to discharge thermal energy generated in the primary side semiconductor unit 21 and the secondary side semiconductor unit 22 to the outside of the casing 1 through the bottom part 2c.

The circuit substrate 30 is arranged between the magnetic component 10 and the semiconductor component 20 in a third direction Z as a thickness direction of the circuit substrate 30. The circuit substrate 30 has a plate shape extended in a first direction X and a second direction Y. As shown in FIG. 1 and FIG. 2, the third direction Z as the thickness direction is perpendicular to the first direction X and the second direction Y. The first direction X is perpendicular to the second direction Y. The circuit substrate 30 is fixed to the casing 2. The circuit substrate 30 has a control circuit 31 which controls behavior of the semiconductor component 20 composed of the primary side semiconductor unit 21 and the secondary side semiconductor unit 22.

The first thermal conductive part 40 is fixed to the casing 2 so as to perform thermal conduction between them. The first thermal conductive part 40 and the casing 2 are different members from each other. The first thermal conductive part 40 is fastened and fixed to the casing 2 through a fastening part (not shown) formed in the casing 2. That is, the first thermal conductive part 40 is fixed to the casing 2 by using a screw member screwed into the fastening part.

This structure previously described makes it possible to increase adhesion between the first thermal conductive part 40 and the casing 2, and to improve the thermal energy discharge between the first thermal conductive part 40 and the casing 2. This improved structure allows the first thermal conductive part 40 and the casing 2 to be easily assembled together and to provide easy maintenance of them.

The first magnetic unit 11 and the second magnetic unit 12 of the magnetic component 10 are jointed together on a first thermal discharge surface 40a of the first thermal conductive part 40 through a first thermal discharge surface 11a of the first magnetic unit 11 and a second thermal discharge surface 12a of the second magnetic unit 12. As shown in FIG. 1, the first thermal discharge surface 11a of the first magnetic unit 11 and the second thermal discharge surface 12a of the second magnetic unit 12 correspond to discharge surfaces 10a of the magnetic component 10.

Thermal energy generated in the first magnetic unit 11 and the second magnetic unit 12 of the magnetic component 10 is discharged through the first thermal conductive part 40. The first thermal conductive part 40 is made of material having a superior thermal conductivity and has a strength to support the magnetic component 10.

For example, the first thermal conductive part 40 is made of metal material such as copper, aluminum, etc. It is preferable for the first thermal conductive part 40 to have a thickness capable of supporting the magnetic component 10 composed of the first magnetic unit 11 and the second magnetic unit 12. This structure allows thermal energy generated in the magnetic component 10 to be discharged from the first thermal conductive part 40 to the casing 2. Finally, the generated thermal energy can be discharged to the outside of the casing 2 with high efficiency.

The first thermal conductive part 40 is composed of a plate member which extends along an extension surface A of the circuit substrate 30. The first thermal conductive part 40 is arranged between the circuit substrate 30 and the magnetic component 10 composed of the first magnetic unit 11 and the second magnetic unit 12 when viewed in the third direction Z.

This extension surface A of the circuit substrate 30 is arranged on a surface area determined in the first direction X and the second direction Y. That is, as shown in FIG. 1, the circuit substrate 30 is arranged approximately parallel to the first thermal conductive part 40. A cross section of the first thermal conductive part 40 in the third direction Z substantially has a rectangle shape.

The first thermal conductive part 40 has the plate member previously described in which a thickness there is significantly smaller than a vertical dimension and a lateral dimension thereof.

The first thermal conductive part 40 is arranged to be overlapped in the third direction with the first magnetic unit 11 and the second magnetic unit 12 of the magnetic component 10. The first thermal conductive part 40 faces, without electrical connection, the first thermal discharge surface 11a of the first magnetic unit 11 and the second thermal discharge surface 12a of the second magnetic unit 12 so as to conduct thermal energy generated in the first magnetic unit 11 and the second magnetic unit 12 of the magnetic component 10 and to discharge the generated thermal energy to the magnetic component 10.

As shown in FIG. 1, an inner chamber of the casing 2 is divided into three chambers, i.e. first, second and third chambers 3a, 3b and 3c by the circuit substrate 30 and the first thermal conductive part 40.

The first chamber 3a is formed at the upper side of the casing 3 on the first thermal conductive part 40 in the third direction Z, which is opposite to the location of the circuit substrate 30 in the third direction Z. As shown in FIG. 1, the first magnetic unit 11 and the second magnetic unit 12 of the magnetic component 10 are arranged on the first thermal conductive part 40.

The second chamber 3b is formed between the circuit substrate 30 and the first thermal conductive part 40 in the third direction Z.

The third chamber 3c is formed at the bottom side of the casing 3 below the second chamber 3b and the circuit substrate 30 in the third direction Z. As shown in FIG. 1, the primary side semiconductor unit 21 and the secondary side semiconductor unit 22 of the semiconductor component 20 are arranged in the third chamber 3c.

The first magnetic unit 11 in the magnetic component 10 is a choke coil (hereinafter, which will also be referred to as the choke coil 11). The choke coil 11 has a thermal discharge surface 11a as the discharge surfaces 10a of the magnetic component 10. The second magnetic unit 12 is a transformer (hereinafter, which will also be referred to as the transformer 12) composed of a primary coil 18 and a secondary coil 19.

Figure 3:
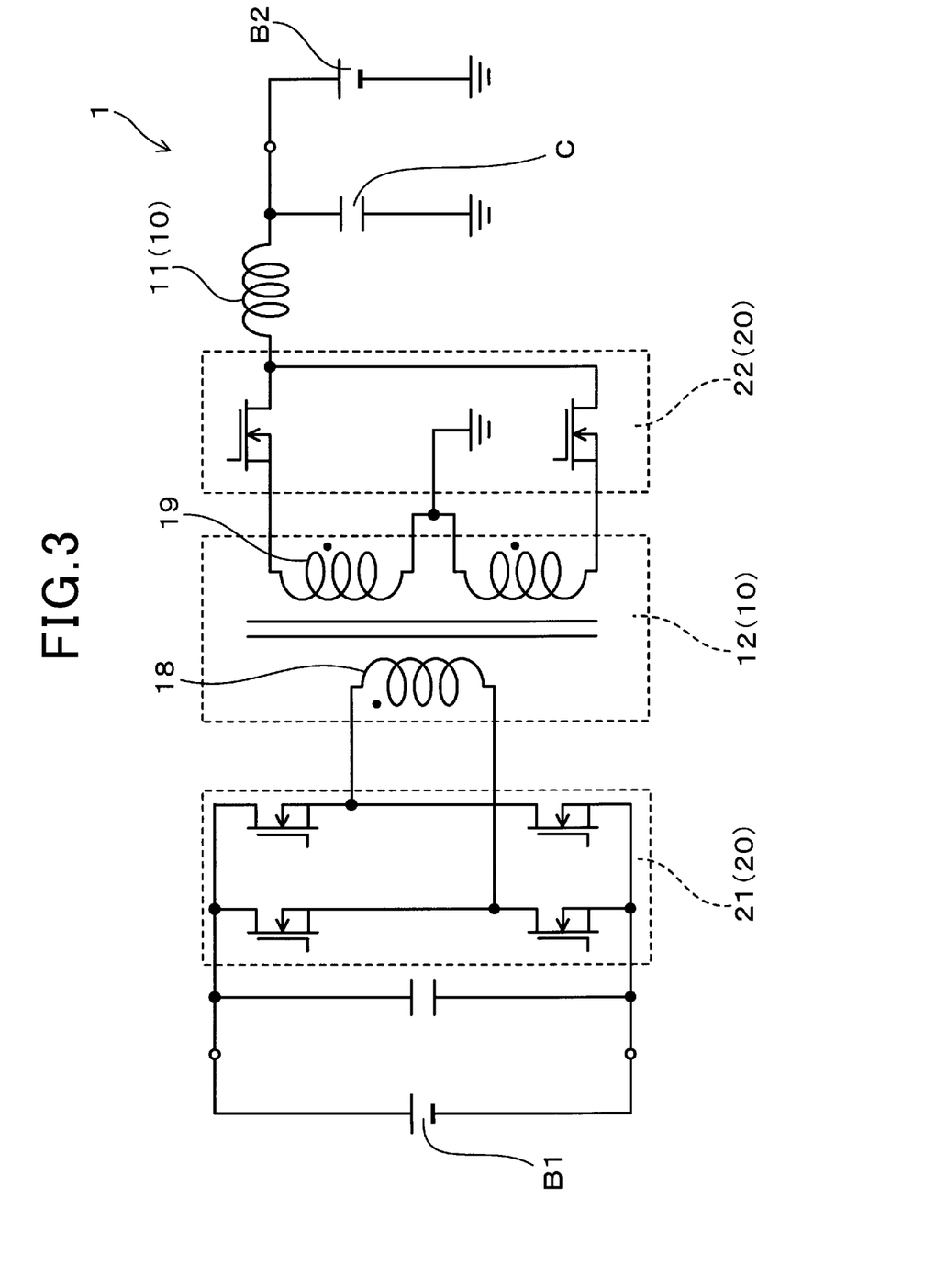
FIG. 3 is a circuit view of a transformer in the DC-DC converter as the electric power source device according to the first exemplary embodiment shown in FIG. 1.

FIG. 3 is a circuit view of the transformer 12 in the DC-DC converter 1 as the electric power source device according to the first exemplary embodiment shown in FIG. 1. As shown in FIG. 3, the transformer 12 has the primary coil 18 and the secondary coil 19. The second magnetic unit 12 has the second thermal discharge surface 12a to discharge thermal energy.

Each of the choke coil 11 and the transformer 12 has a winding structure in which a copper winding is wound and generates heat energy. The choke coil 11 is an inductor with a resistance to attenuate a high frequency. On the other hand, the transformer 12 performs a voltage step-down and/or boosts an alternating current voltage (AC voltage). The more a size of a power source device increases, the more heat energy is generated therein.

As shown in FIG. 3 and previously explained, the primary side semiconductor unit 21 forms the semiconductor component 20. The primary side semiconductor unit 21 forms a primary side circuit. The primary side circuit is connected to the primary coil 18 of the transformer 12.

The secondary side semiconductor unit 22 also forms the semiconductor component 20. The secondary side semiconductor unit 22 and the choke coil 11 form a secondary side circuit. The secondary side circuit is connected to the secondary coil 19 of the transformer 12.

As shown in FIG. 1, a penetration hole 41 is formed in the first thermal conductive part 40 along the third direction Z. The transformer 12 which forms the magnetic component 10 is electrically connected to the circuit substrate 30 through a first conductive member 15. Further, the primary side semiconductor unit 21 is electrically connected to the circuit substrate 30 and the semiconductor component 20 through a second conductive member 16 and a third conductive ember 17. That is, the transformer 12 is electrically connected to the primary side semiconductor unit 21 through the first conductive member 15, the second conductive member 16, the third conductive ember 17 and the circuit substrate 30. As shown in FIG. 1, the first conductive member 15 is inserted into the penetration hole 41 formed in the first thermal conductive part 40 so as to form an electrical path between the transformer 12 and the primary side semiconductor unit 21.

As shown in FIG. 1, the DC-DC converter 1 as the electric power source device according to the first exemplary embodiment has a first stacked body E1 and a second stacked body E2.

In the first stacked body E1, the choke coil 11 and the secondary side semiconductor unit 22 are stacked in the third direction Z as a thickness direction of the circuit substrate 30, and the circuit substrate 30 and the first thermal conductive part 40 are sandwiched between the choke coil 11 and the secondary side semiconductor unit 22 in the third direction Z.

In the second stacked body E2, the transformer 12 and the primary side semiconductor unit 21 are stacked in the third direction Z as the thickness direction of the circuit substrate 30, and the circuit substrate 30 and the first thermal conductive part 40 are sandwiched between the transformer 12 and the primary side semiconductor unit 21 in the third direction Z.

The first stacked body E1 and the second stacked body E2 are arranged along the first direction X to form a gap G between the first stacked body E1 and the second stacked body E2. The first direction X is perpendicular to the third direction Z.

As shown in FIG. 3, the DC-DC converter 1 as the power source device according to the first exemplary embodiment is arranged between a primary side DC battery B1 and a secondary side DC battery B2 as an auxiliary battery, etc. The primary side circuit formed by the primary side semiconductor unit 21 is connected to the primary side DC battery B1. The secondary side circuit formed by the secondary side semiconductor unit 22 is connected to the secondary side DC battery B2 through a smoothing circuit composed of the choke coil 11 and the capacitor C.

As shown in FIG. 1, the choke coil 11 is electrically connected to the secondary side semiconductor unit 22 through a conductive member 13. The secondary side semiconductor unit 22 is electrically connected to the transformer 12 through a conductive member 14.

It is possible to connect the secondary side semiconductor unit 22 to the transformer 12 through the conductive member 14 while the conductive member 14 and the first conductive member 15 are inserted in the penetration hole 41 formed in the first thermal conductive part 40. It is also possible to connect the secondary side semiconductor unit 22 to the transformer 12 through the conductive member 14 while the first conductive member 15 only is inserted in the penetration hole 41 formed in the first thermal conductive part 40.

The primary side circuit formed by the primary side semiconductor unit 21 forms a switching circuit. That is, the primary side semiconductor unit 21 is composed of a semiconductor module equipped with a plurality of switching elements such as metal oxide semiconductor field effect transistors (MOS FETs) or insulated gate bipolar transistors (IGBTs). On the other hand, it is possible to form the primary side semiconductor unit 21 by using discrete semiconductor devices without using semiconductor modules.

The secondary side circuit forms a rectifier circuit. The secondary side semiconductor unit 22 forming the secondary side circuit is a semiconductor module composed of a plurality of switching elements. It is also possible to use MOS FETs or IGBTs as the plurality of switching elements in the secondary side semiconductor unit 22. It is also acceptable to use a diode module in which a plurality of diodes are built. It is also acceptable to use a discrete semiconductor unit as the secondary side semiconductor unit 22

The choke coil 11 and the capacitor C form the smoothing circuit. The switching circuit in the primary side circuit converts, to an AC power, a DC power supplied to the DC-DC converter 1 as the electric power source device according to the first exemplary embodiment. The Obtained AC power is supplied to the transformer 12. The transformer 12 performs a voltage step-down, i.e. reduces the received AC power. The rectifier circuit in the secondary side circuit rectifies the reduced AC power, and supplied a DC power. The smoothing circuit smoothes the DC power supplied from the rectifier circuit. The smoothed DC power is charged by the secondary side DC battery B2.

It is possible for the DC-DC converter 1 as the electric power source device according to the first exemplary embodiment to boost the DC power supplied from the secondary side DC battery B2. The primary side DC battery B1 is charged by the boosted DC power.

The control circuit 31 arranged on the circuit substrate 30 is configured to perform the turning on/off control of the primary side semiconductor unit 21 and the secondary side semiconductor unit 22. Accordingly, signal terminals, for example gate terminals of MOS FETs in the primary side semiconductor unit 21 and the secondary side semiconductor unit 22 are connected to the control circuit 31 arranged on the circuit substrate 30.

In the structure of the DC-DC converter 1 as the electric power source device according to the first exemplary embodiment, the primary side semiconductor unit 21 and the secondary side semiconductor unit 22 are directly connected to the circuit substrate 30 have lead terminals. The lead terminals of the primary side semiconductor unit 21 and the secondary side semiconductor unit 22 are directly connected to the circuit substrate 30. These lead terminals are signal terminals connected to the gates of the switching elements forming the primary side semiconductor unit 21 and the secondary side semiconductor unit 22. It is also acceptable to directly connect, to the circuit substrate 30, lead terminals connected to sources and drains of these switching elements to the circuit substrate 30.

When switching elements are composed of IGBTs, the lead terminals are connected to the emitters and collectors thereof.

A description will now be given of thermal energy discharge structure of the first thermal conductive part 40 in the DC-DC converter 1 as the electric power source device according to the first exemplary embodiment with reference to FIG. 4.

Figure 4:
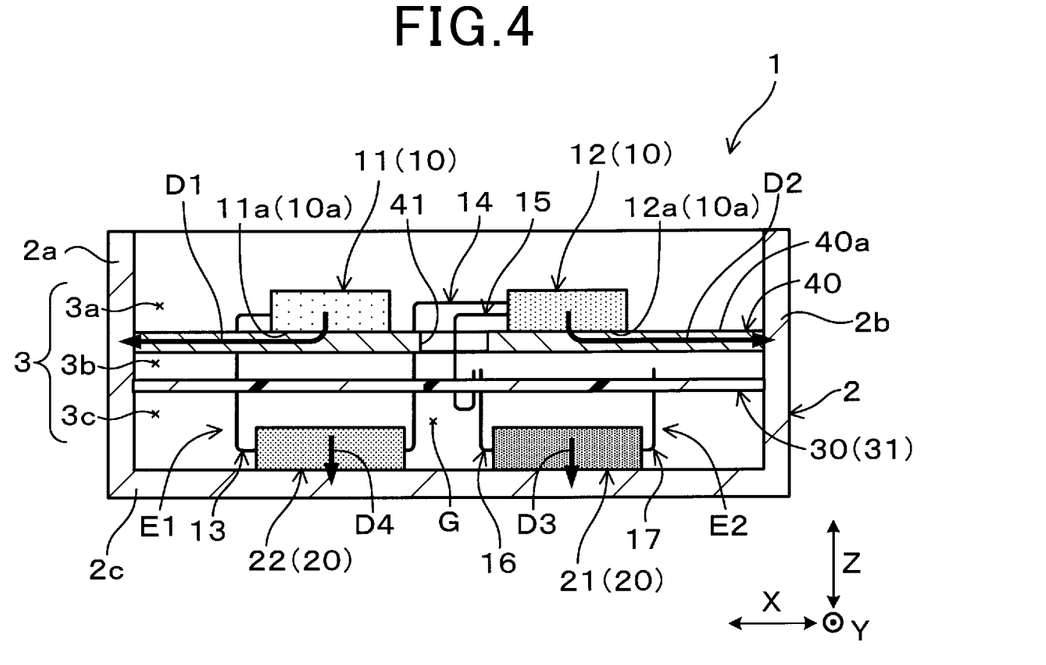
FIG. 4 is a view showing a cross section of the DC-DC converter as the electric power source device according to the first exemplary embodiment so as to explain a thermal energy discharge flow, designated by bold arrows, of thermal energy generated in magnetic units and discharged through a thermal conductive component.

FIG. 4 is a view showing a cross section of the DC-DC converter 1 so as to explain a thermal energy discharge flow, designated by bold arrows, of thermal energy generated in the magnetic units and discharged through the thermal conductive component.

In the structure of the DC-DC converter 1 as the electric power source device according to the first exemplary embodiment, the choke coil 11 and the transformer 12 are joined to the first thermal discharge surface 40a of the first thermal conductive part 40. This structure allows thermal energy generated in the choke coil 11 and the transformer 12 to be discharged to the first thermal conductive part 40. The thermal energy of the first thermal conductive part 40 is conducted to the casing 2.

That is, the thermal energy generated in the choke coil 11 is conducted through a first thermal energy discharge path D1 designated by the bold arrows shown in FIG. 4. The first thermal energy discharge path D1 is formed along the first direction X from the choke coil 11 to a first side wall 2a of the casing 2 through the first thermal conductive part 40.

Further, the thermal energy generated in the transformer 12 is conducted through a second thermal energy discharge path D2 designated by the bold arrows shown in FIG. 4. This second thermal energy discharge path D2 is formed along the first direction X from the transformer 12 to a second side wall 2b of the casing 2 through the first thermal conductive part 40.

Because the first thermal energy discharge path D1 and the second thermal energy discharge path D2 are formed in opposite direction from each other, this structure prevents thermal interference between these paths D1 and D2 from occurring, and performs improved discharge of thermal energy generated in the choke coil 11 and the transformer 12 with high efficiency.

The improved structure of the DC-DC converter 1 as the electric power source device allows thermal energy generated in the primary side semiconductor unit 21 and the secondary side semiconductor unit 22 to be discharged directly to the casing 2 because the primary side semiconductor unit 21 and the secondary side semiconductor unit 22 are directly joined to the bottom part 2c of the casing 2.

This improved structure of the DC-DC converter 1 as the electric power source device according to the first exemplary embodiment makes it possible to cool both the primary side semiconductor unit 21 and the secondary side semiconductor unit 22 simultaneously.

In more detail, the thermal energy generated in the primary side semiconductor unit 21 is discharged to the casing 2 through a third thermal energy discharge path D3 designated by the bold arrows shown in FIG. 4. The third thermal energy discharge path D3 is formed from the primary side semiconductor unit 21 to the casing 2 through the bottom part 2c of the casing 2.

Further, the thermal energy generated in the secondary side semiconductor unit 22 is discharged to the casing 2 through a fourth thermal energy discharge path D4 designated by the bold arrows shown in FIG. 4. The fourth thermal energy discharge path D4 is formed from the secondary side semiconductor unit 22 to the casing 2 through the bottom part 2c of the casing 2.

The structure of the DC-DC converter 1 previously described allows thermal energy generated in the primary side semiconductor unit 21 and thermal energy generated in the secondary side semiconductor unit 22 to be discharged to the casing 2 independently in parallel from each other through the third first thermal energy discharge path D3 and the fourth thermal energy discharge path D4. That is, because thermal energy is discharged parallel from each other through the third first thermal energy discharge path D3 and the fourth thermal energy discharge path D4, this structure makes it possible to prevent thermal interference between the third first thermal energy discharge path D3 and the fourth thermal energy discharge path D4 from occurring, and performs improved discharge of thermal energy generated in the primary side semiconductor unit 21 and the secondary side semiconductor unit 22 with high efficiency.

A description will be given of behavior and effects of the DC-DC converter 1 as the electric power source device according to the first exemplary embodiment.

In the improved structure of the DC-DC converter 1 as the electric power source device, the magnetic component 10 is electrically connected to the semiconductor component 20. The circuit substrate 30 is electrically connected to the semiconductor component 20 so as to control behavior of the semiconductor component 20 composed of the primary side semiconductor unit 21 and the secondary side semiconductor unit 22.

On the other hand, the first thermal conductive part 40 is arranged facing the discharge surfaces 10a of the magnetic component 10 in the third direction Z without electric connection between the first thermal conductive part 40, the semiconductor component 20 and the circuit substrate 30. That is, the first thermal conductive part 40 is arranged in a structure in which the circuit substrate 30, the first thermal conductive part 40 and the magnetic component 10 are stacked in the third direction Z. This arrangement makes it possible to discharge thermal energy generated in the magnetic component 10 composed of the first magnetic unit 11 and the second magnetic unit 12 to the first thermal conductive part 40 along the third direction Z.

In particular, the semiconductor component 20 and the circuit substrate 30 are not electrically connected to the first thermal conductive part 40. Accordingly, the first thermal conductive part 40 has a thermal energy discharging capability only because the first thermal conductive part 40 is arranged facing the discharge surfaces 10a of the magnetic component 10.

The improved structure of the DC-DC converter 1 as the electric power source device does not limit the structure of the magnetic component 10 in view of the thermal energy discharge capability due to the structure of the first thermal conductive part 40. That is, the improved structure of the DC-DC converter 1 as the electric power source device does not require the reduction in thickness of the first thermal conductive part 40 in order to maintain electronic conductivity. This structure allows the structure such as a thickness and a dimension of each of the first thermal conductive part 40 and the magnetic component 10 to have independently determined.

As previously described in detail, the first exemplary embodiment provides the DC-DC converter 1 as the electric power source device having the superior thermal energy discharge capability.

In the improved structure of the DC-DC converter 1 as the electric power source device according to the first exemplary embodiment, because the first thermal conductive part 40 is thermally connected to the casing 2, this allows thermal energy conducted from the magnetic component 10 to the first thermal conductive part 40 to be easily and smoothly conducted to the casing 2. In addition to this feature, because the semiconductor component 20 is thermally connected to the casing 2, this structure smoothly conducts thermal energy generated in the semiconductor component 20 to the casing 2. This makes it possible to improve the thermal energy discharge capability of the DC-DC converter 1.

In the improved structure of the DC-DC converter 1 as the electric power source device according to the first exemplary embodiment, the first thermal conductive part 40 is arranged between the magnetic component 10 and the semiconductor component 20 in the third direction Z. This structure makes it possible for the first thermal conductive part 40 to perform thermal energy discharge of both of the magnetic component 10 and the semiconductor component 20.

In the improved structure of the DC-DC converter 1 as the electric power source device according to the first exemplary embodiment, the circuit substrate 30 is arranged between the magnetic component 10 and the semiconductor component 20, the first thermal conductive part 40 having a plate shape is arranged between the magnetic component 10 and the circuit substrate 30, and the circuit substrate 30 is arranged substantially in parallel with the first thermal conductive part 40 in the third direction Z. This arrangement suppresses the thickness in the third direction Z of the DC-DC converter 1 as the electric power source device from increasing, and allows the overall size of the DC-DC converter 1 to be miniaturized.

In the improved structure of the DC-DC converter 1 as the electric power source device, the first conductive member 15 is inserted into the penetration hole 41 formed in the first thermal conductive part 40 so as to form the electrical path between the transformer 12 as the magnetic component 10 and the primary side semiconductor unit 21. This structure makes it possible to reduce the total length of the first conductive member 15, and to reduce a formation area necessary to form the first conductive member 15.

In the improved structure of the DC-DC converter 1 as the electric power source device according to the first exemplary embodiment, the first stacked body E1 and the second stacked body E2 are arranged in parallel with a gap G in the first direction X. This arrangement makes it possible to separate the first thermal energy discharge path D1 and the second thermal energy discharge path D2 from the third thermal energy discharge path D3 and the fourth thermal energy discharge path D4, where heat energy generated in the choke coil 11 is discharged through the first thermal energy discharge path D1, heat energy generated in the transformer 12 is discharged through the second thermal energy discharge path D2, and heat energy generated in the primary side semiconductor unit 21 is discharged through the third thermal energy discharge path D3. This arrangement makes it possible to suppress thermal interference between the first stacked body E1 and the second stacked body E2.

Second Exemplary Embodiment

A description will be given of a DC-DC converter as the electric power source device according to a second exemplary embodiment with reference to FIG. 5 and FIG. 6.

The DC-DC converter 101 according to the second exemplary embodiment has a structure which is different from that of the DC-DC converter 1 according to the first exemplary embodiment previously described.

Figure 5:
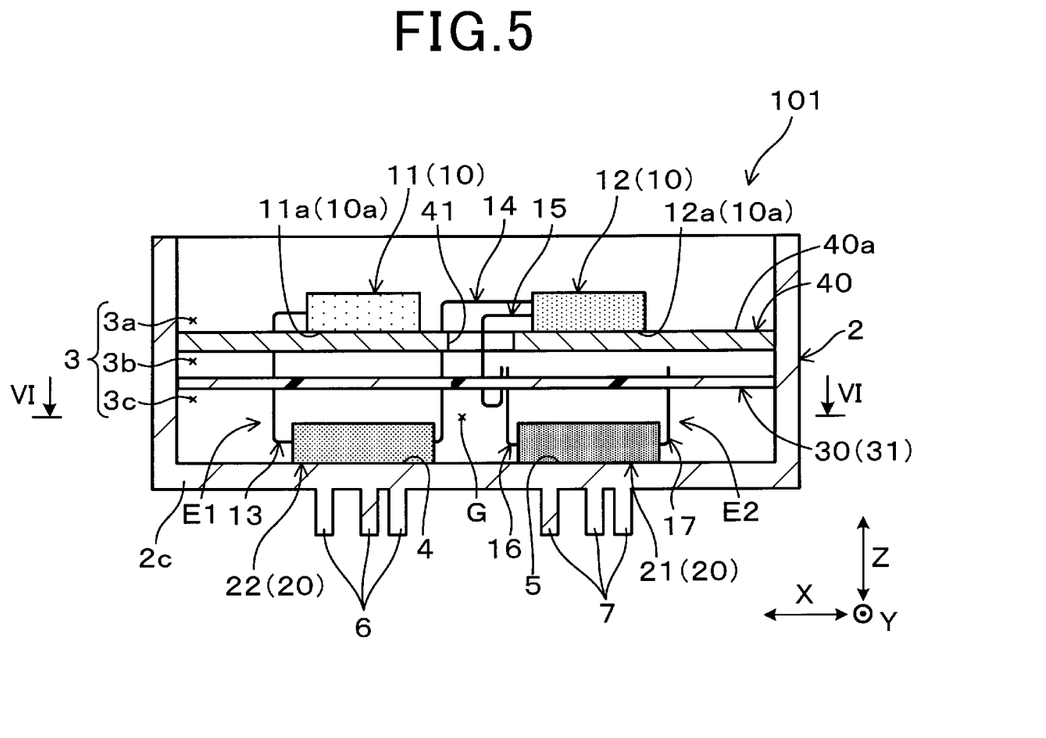
FIG. 5 is a view showing a cross section of the DC-DC converter as the electric power source device according to a second exemplary embodiment of the present disclosure.

FIG. 5 is a view showing a cross section of the DC-DC converter 101 as the electric power source device according to the second exemplary embodiment. FIG. 6 is a view showing a cross section of the DC-DC converter 101 along the line VI-VI shown in FIG. 5. As shown in FIG. 5 and FIG. 6, the DC-DC converter 101 has a plurality of discharge fins 6 and 7 extending from the outside surface of the bottom part 2c of the casing 2 at which a projected surface 4 of the first stacked body E1 on the bottom part 2c and a projected surface 5 of the second stacked body E2 on the bottom part 2c are overlapped with the outside surface of the bottom part 2c of the casing 2. That is, the plurality of projection fins 6, 7 are projected from the outside surface of the bottom part 2c of the casing 2. The casing 2 having the plurality of radiation fins 6, 7 is a monolithic member.

The specific structure in which the plurality of discharge fins 6, 7 expend from the surface overlapped with the projected surfaces 4, 5 (see FIG. 5) previously described includes various structural modifications. For example, it is possible to form the discharge fins projected form a part of the outside surface of the bottom part 2c of the casing 2.

As shown in FIG. 5, each of the plurality of discharge fins 6, 7 is arranged parallel to the first direction X along which the first stacked body E1 and the second stacked body E2 are arranged. A width direction of each of the discharge fins 6 and 7 corresponds to the first direction X, a longitudinal direction of each of the discharge fins 6 and 7 corresponds to the second direction Y, and a height direction of each of the discharge fins 6, 7 corresponds to the third direction Z.

Figure 6:
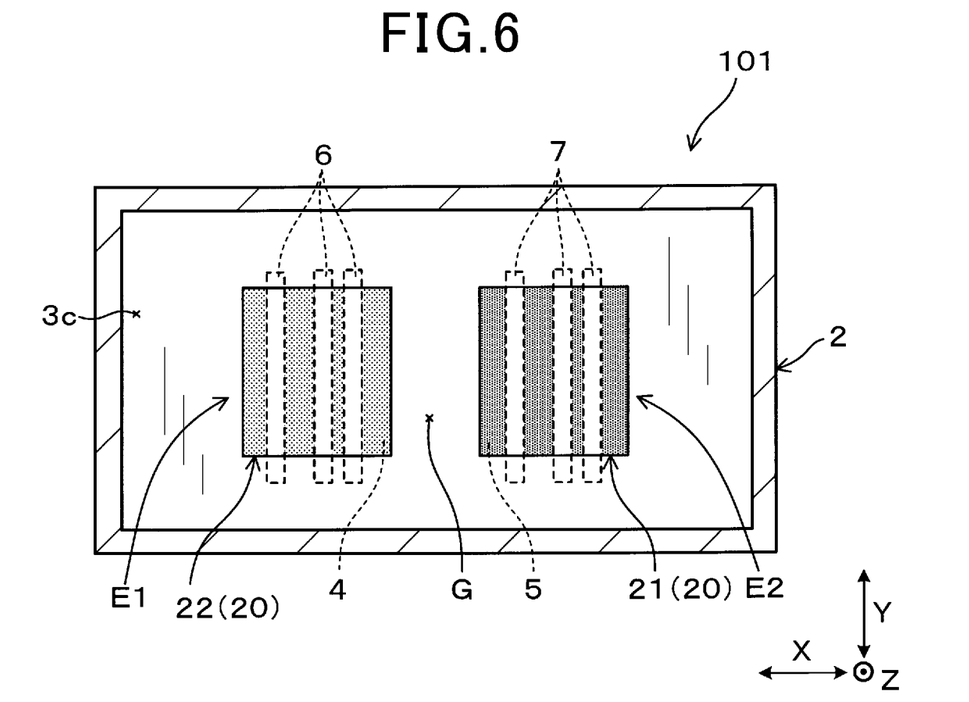
FIG. 6 is a view showing a cross section of the DC-DC converter as the electric power source device along the line VI-VI shown in FIG. 5.

As shown in FIG. 5 and FIG. 6, the total numbers of the discharge fins 6 is three, and the total numbers of the discharge fins 7 is also three. That is, the three discharge fins 6 are arranged in the first direction X at different intervals, and the three discharge fins 7 are also arranged in the first direction X at different intervals.

As shown in FIG. 6, a length in the second direction Y of each of the three discharge fins 6 is longer than a length in the second direction Y of the projected surface 4 of the first stacked body E1. Similarly, as shown in FIG. 6, a length in the second direction Y of each of the three discharge fins 7 is longer than a length in the second direction Y of the projected surface 5 of the second stacked body E2.

The concept of the DC-DC converter 101 according to the second exemplary embodiment is not limited by the structure previously described shown in FIG. 5 and FIG. 6. For example, according to structural necessary, it is possible for the casing 2 to have a plurality of the discharge fins 6, 7, the number thereof other than three.

Further, according to structural necessary, it is possible to select one or more selected from the following arrangement:

an arrangement in which some of the discharge fins 6 and 7 are arranged at regular intervals;

an arrangement in which some of the discharge fins 6 and 7 are formed with an intersecting arrangement;

an arrangement in which at least one of the discharge fins 6 and 7 is formed by using another member; and an arrangement in which the longitudinal part of each of the discharge fins 6 and 7 is aligned along the first direction X and the width part of each of the discharge fins 6 and 7 is aligned along the second direction Y.

As previously described, the improved structure of the DC-DC converter 1 according to the second exemplary embodiment makes it possible to independently discharge thermal energy conducted from the secondary side semiconductor unit 22 in the first stacked body E1 to the bottom part 2c of the casing 2 through the discharge fins 6, and to independently discharge thermal energy conducted from the primary side semiconductor unit 21 in the second stacked body E2 to the bottom part 2c of the casing 2 through the discharge fins 7. In this case, this structure makes it possible to suppress occurrence of thermal interference between heat energy of the secondary side semiconductor unit 22 conducted to the bottom part 2c of the casing 2 and heat energy conducted of the primary side semiconductor unit 21 conducted to the bottom part 2c of the casing 2.

It is further possible to increase the total number of the plurality of discharge fins 6 and 7 per unit area when these discharge fins 6 and 7 are arranged parallel from each other.

The DC-DC converter 101 as the electric power source device according to the second exemplary embodiment has the same behavior and effects as the DC-DC converter 1 according to the first exemplary embodiment.

Third Exemplary Embodiment

A description will be given of a DC-DC converter 201 as the electric power source device according to a third exemplary embodiment with reference to FIG. 7.

Figure 7:
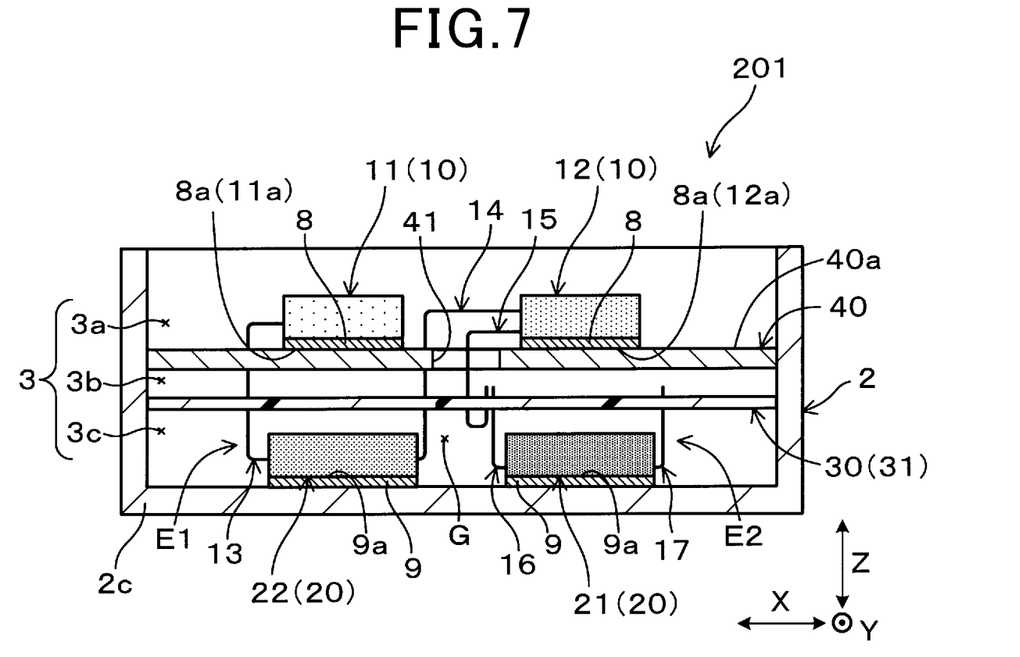
FIG. 7 is a view showing a cross section of the DC-DC converter as the electric power source device according to a third exemplary embodiment of the present disclosure.

FIG. 7 is a view showing a cross section of the DC-DC converter 201 as the electric power source device according to the third exemplary embodiment of the present disclosure.

As shown in FIG. 7, the DC-DC converter 201 as the electric power source device according to the third exemplary embodiment has a first connection structure between the magnetic component 10 and the first thermal conductive part 40 and a second connection structure between the semiconductor component 20 and the casing 2. The first connection structure and the second connection structure in the DC-DC converter 201 are different from those in the DC-DC converter 1 as the electric power source device according to the first exemplary embodiment. Other components and structure of the DC-DC converter 201 according to the third exemplary embodiment are the same as these of the DC-DC converter 1 according to the first exemplary embodiment. The explanation of these same components and structure is omitted here for brevity.

In the structure of the DC-DC converter 201 according to the third exemplary embodiment shown in FIG. 7, a first connection layer 8 is formed between the first thermal conductive part 40 and each of the choke coil 11 and the transformer 12. In more detail, as shown in FIG. 7, each of the choke coil 11 and the transformer 12 is connected to the first thermal discharge surface 40a of the first thermal conductive part 40 through the first connection layer 8. A connection surface 8a of the first connection layer 8 which is in contact with the choke coil 11 becomes the first thermal discharge surface 11a of the choke coil 11. Similarly, the connection surface 8a of the first connection layer 8 which is in contact with the transformer 12 becomes the second thermal discharge surface 12a of the transformer 12.

Further, in the structure of the DC-DC converter 201 according to the third exemplary embodiment shown in FIG. 7, a second connection layer 9 is formed between the first thermal conductive part 40 and each of the primary side semiconductor unit 21 and the secondary side semiconductor unit 22. In more detail, as shown in FIG. 7, each of the primary side semiconductor unit 21 and the secondary side semiconductor unit 22 is connected to bottom part 2c of the casing 2 through the second connection layer 9. A connection surface 9a of the second connection layer 9 which is in contact with the primary side semiconductor unit 21 becomes a thermal discharge surface of the primary side semiconductor unit 21. Similarly, the connection surface 9a of the second connection layer 9 which is in contact with the secondary side semiconductor unit 22 becomes a thermal discharge surface of the secondary side semiconductor unit 22.

It is preferable to form the first and second connection layers 8 and 9 by using sheet member and a grease layer having a superior thermal conductor with superior adhesion capabilities. This makes it possible to improve thermal energy discharge capability of the magnetic component 10 composed of the first magnetic unit 11 and the second magnetic unit 12 and to improve thermal energy discharge capability of the semiconductor component 20 composed of the primary side semiconductor unit 21 and the secondary side semiconductor unit 22.

It is acceptable to eliminate at least one of the four connection layers 8 and 9 from the structure of the DC-DC converter 201.

Other components and structure of the DC-DC converter 201 according to the third exemplary embodiment are the same as these of the DC-DC converter 1 according to the first exemplary embodiment.

It is possible to apply the connection structure of the first connection layer 8 and the second connection layer 9 in the DC-DC converter 201 according to the third exemplary embodiment to the DC-DC converter 101 according to the second exemplary embodiment.

Fourth Exemplary Embodiment

A description will be given of a DC-DC converter 301 as the electric power source device according to a fourth exemplary embodiment with reference to FIG. 8.

Figure 8:
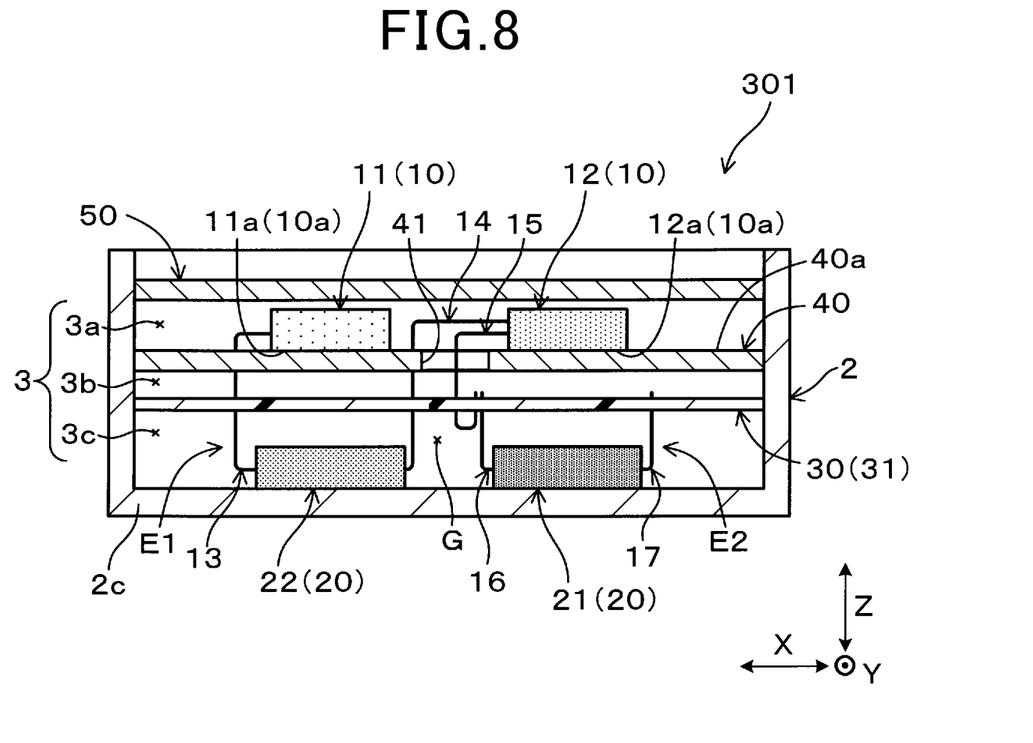
FIG. 8 is a view showing a cross section of the DC-DC converter as the electric power source device according to a fourth exemplary embodiment of the present disclosure.

FIG. 8 is a view showing a cross section of the DC-DC converter 301 as the electric power source device according to the fourth exemplary embodiment. As shown in FIG. 8, the DC-DC converter 301 as the electric power source device has a second thermal conductive part 50 as an additional thermal conductive part (i.e., the thermal conductive component) in addition to the first thermal conductive part 40 of the DC-DC converter 1 according to the first exemplary embodiment. Other components and structure of the DC-DC converter 301 according to the fourth exemplary embodiment are the same as these of the DC-DC converter 1 according to the first exemplary embodiment. The explanation of these same components and structure is omitted here for brevity.

In the structure of the DC-DC converter 301 according to the fourth exemplary embodiment shown in FIG. 8, the second thermal conductive part 50 is arranged above the magnetic component 10 composed of the first magnetic unit 11 and the second magnetic unit 12 arranged on the first thermal conductive part 40. Similar to the first thermal conductive part 40, the second thermal conductive part 50 is fixed to the casing 2. The second thermal conductive part 50 is arranged substantially parallel with the first thermal conductive part 40. Similar to the first thermal conductive part 40, the second thermal conductive part 50 is arranged to satisfy the thermal conduction with the casing 2. The second thermal conductive part 50 has a plate shape which is substantially equal to the same shape as the first thermal conductive part 40. The second thermal conductive part 50 and the first thermal conductive part 40 are made of a same material.

The second thermal conductive part 50 is arranged to be overlapped with the magnetic component 10 composed of the first magnetic unit 11 and the second magnetic unit 12 in the third direction Z. Further, the second thermal conductive part 50 is arranged facing the thermal discharge surface of the magnetic component 10 without being in contact with the semiconductor component 20 and the circuit substrate 30. This structure makes it possible for the second thermal conductive part 50 to have the same thermal discharge function as the first thermal conductive part 40.

On the other hand, the second thermal conductive part 50 is not in contact with the magnetic component 10, and has no penetration hole such as the penetration hole 41 formed in the first thermal conductive part 40. It is accordingly possible for the second thermal conductive part 50 to be directly in contact with the thermal discharge surface of the magnetic component 10 and to have a penetration hole to which an electric conductive member is inserted.

The structure of the DC-DC converter 301 as the electric power source device according to the fourth exemplary embodiment shown in FIG. 8 has more improved thermal discharge capability.

The DC-DC converter 301 as the electric power source device according to the fourth exemplary embodiment has the same behavior and effects as the DC-DC converter 1 according to the first exemplary embodiment.

It is possible for the DC-DC converter 301 as the electric power source device according to the fourth exemplary embodiment to have the second thermal conductive part 50 only without having the first thermal conductive part 40. Further, it is acceptable to add one or more additional thermal conductive parts to the structure of the first thermal conductive part 40 and the second thermal conductive part 50 in the DC-DC converter 301.

Various Modifications

The concept of the present disclosure is not limited by the first to fourth exemplary embodiments previously described. It is possible for the DC-DC converter as the electric power source device to have various modifications.

Each of the first to fourth exemplary embodiment has shown the structure in which the magnetic component 10 has the first magnetic unit 11 and the second magnetic unit 12, and the semiconductor component 20 has the primary side semiconductor unit 21 and the secondary side semiconductor unit 22. However, the concept of the present disclosure is not limited by this structure. In the DC-DC converter as the electric power source device, it is acceptable for each of the magnetic component 10 and the semiconductor component 20 to have plural parts and units according to necessary.

Each of the first to fourth exemplary embodiment has shown the structure having the first stacked body E1 in which the choke coil 11 and the secondary side semiconductor unit 22 are stacked in the third direction Z and the second stacked body E2 in which the transformer 12 and the primary side semiconductor unit 21 are stacked in the third direction Z. However, the concept of the present disclosure is not limited by this structure. It is acceptable for the DC-DC converter as the electric power source device to have a structure in which the choke coil 11 and the primary side semiconductor unit 21 are stacked in the first stacked body E1, and the transformer 12 and the secondary side semiconductor unit 22 are stacked in the second stacked body E2.

Each of the first to fourth exemplary embodiment has shown the structure in which the first thermal conductive part 40 is fixed to the casing 2. However, the concept of the present disclosure is not limited by this structure. It is acceptable for the DC-DC converter as the electric power source device to have a structure in which the first thermal conductive part 40 is fixed to another component instead of the casing 2.

Each of the first to fourth exemplary embodiment has shown the structure in which the magnetic component 10 is joined to the first thermal discharge surface 40a of the first thermal conductive part 40. However, the concept of the present disclosure is not limited by this structure. It is acceptable for the DC-DC converter as the electric power source device to have a structure in which the magnetic component 10 is arranged facing the first thermal discharge surface 40a of the first thermal conductive part 40 with a predetermined gap.

Each of the first to fourth exemplary embodiment has shown the structure in which the semiconductor component 20 is joined to the casing 2. However, the concept of the present disclosure is not limited by this structure. It is acceptable for the DC-DC converter as the electric power source device to have a structure in which the semiconductor component 20 is not joined to the casing 2.

Each of the first to fourth exemplary embodiment has shown the structure in which the penetration hole 41 is formed in the first thermal conductive part 40, into which the first conductive member 15 is inserted. However, the concept of the present disclosure is not limited by this structure. It is acceptable for the DC-DC converter as the electric power source device to have the first thermal conductive part 40 without any penetration hole.

Each of the first to fourth exemplary embodiment has shown the structure in which each of the first thermal conductive part 40 and the second thermal conductive part 50 has another shape such as a rod shape, a block shape, a honeycomb structure shape, etc.

While specific embodiments of the present disclosure have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present disclosure which is to be given the full breadth of the following claims and all equivalents thereof.

What is claimed is:

1. An electric power source device comprising:
   a magnetic component having a thermal energy discharge surface;
   a semiconductor component electrically connected to the magnetic component;

a circuit substrate on which a controller is arranged to be electrically connected to the semiconductor component to control behavior of the semiconductor component;

a thermal conductive component arranged in a thickness direction of the circuit substrate to be overlapped with the magnetic component, the thermal conductive component being arranged, without being electrically connected with the semiconductor component or the circuit substrate, to face the thermal energy discharge surface of the magnetic component to allow thermal energy generated in the magnetic component to be conducted with the thermal conductive component; and a casing that accommodates the magnetic component, the semiconductor component, the circuit substrate, and the thermal conductive component, the thermal conductive component being joined to the casing to perform thermal conduction between the thermal conductive component and the casing, and the semiconductor component being directly joined to an inner wall surface of the casing to perform thermal conduction between the semiconductor component and the casing.

2. The electric power source device according to claim 1, wherein the circuit substrate is arranged between the magnetic component and the semiconductor component in the thickness direction of the circuit substrate, and the thermal conductive component is composed of a plate member extending toward an extension surface of the circuit substrate, and arranged between the magnetic component and the circuit substrate.

3. The electric power source device according to claim 2, further comprising:

a penetration hole in the thermal conductive component which penetrates in the thermal conductive component along a thickness direction of the thermal conductive component; and a conductive member is disposed in the penetration hole in the thermal conductive component to form an electrical path between the magnetic component and the semiconductor component.

4. The electric power source device according to claim 1, further comprising:

a choke coil of the magnetic component;

a transformer of the magnetic component, the transformer comprising a primary coil and a secondary coil;

a primary side semiconductor unit of the semiconductor coil that is connected to the primary coil of the transformer;

a primary side circuit composed of the primary side semiconductor unit and the primary coil of the transformer;

a secondary side semiconductor unit of the semiconductor coil, the secondary side semiconductor unit being connected to the secondary coil of the transformer;

a secondary side circuit composed of the secondary side semiconductor unit and the choke coil;

a first stacked body composed of the primary side semiconductor unit stacked with one of the choke coil and the transformer; and a second stacked body composed of the secondary side semiconductor unit stacked with the one of the choke coil and the transformer that is not in the first stacked body, wherein the circuit substrate and the first thermal conductive part are sandwiched between the first stacked body and the second stacked body, in the thickness direction of the circuit substrate, and the first stacked body and the second stacked body are arranged in the casing with a gap therebetween in a direction which is perpendicular to the thickness direction of the circuit substrate.

5. The electric power source device according to claim 2, further comprising:

a choke coil of the magnetic component;

a transformer of the magnetic component, the transformer comprising a primary coil and a secondary coil;

a primary side semiconductor unit of the semiconductor coil that is connected to the primary coil of the transformer;

a primary side circuit composed of the primary side semiconductor unit and the primary coil of the transformer;

a secondary side semiconductor unit of the semiconductor coil, the secondary side semiconductor unit being connected to the secondary coil of the transformer;

a secondary side circuit composed of the secondary side semiconductor unit and the choke coil;

a first stacked body composed of the primary side semiconductor unit stacked with one of the choke coil and the transformer; and a second stacked body composed of the secondary side semiconductor unit stacked with the one of the choke coil and the transformer that is not in the first stacked body, wherein the circuit substrate and the first thermal conductive part are sandwiched between the first stacked body and the second stacked body, in the thickness direction of the circuit substrate, and the first stacked body and the second stacked body are arranged in the casing with a gap therebetween in a direction which is perpendicular to the thickness direction of the circuit substrate.

6. The electric power source device according to claim 3, further comprising:

a choke coil of the magnetic component;

a transformer of the magnetic component, the transformer comprising a primary coil and a secondary coil;

a primary side semiconductor unit of the semiconductor coil that is connected to the primary coil of the transformer;

a primary side circuit composed of the primary side semiconductor unit and the primary coil of the transformer;

a secondary side semiconductor unit of the semiconductor coil, the secondary side semiconductor unit being connected to the secondary coil of the transformer;

a secondary side circuit composed of the secondary side semiconductor unit and the choke coil;

a first stacked body composed of the primary side semiconductor unit stacked with one of the choke coil and the transformer; and a second stacked body composed of the secondary side semiconductor unit stacked with the one of the choke coil and the transformer that is not in the first stacked body, wherein the circuit substrate and the first thermal conductive part are sandwiched between the first stacked body and the second stacked body, in the thickness direction of the circuit substrate, and the first stacked body and the second stacked body are arranged in the casing with a gap therebetween in a direction which is perpendicular to the thickness direction of the circuit substrate.

7. The electric power source device according to claim 4, wherein
a plurality of discharge fins extend from an outside surface of the casing at a location which is overlapped with a projected surface of the first stacked body and a projected surface of the second stacked body on the casing.

8. The electric power source device according to claim 5, further comprising:
a plurality of discharge fins that extend from an outside surface of the casing at a location which is overlapped with a projected surface of the first stacked body and a projected surface of the second stacked body on the casing.

9. The electric power source device according to claim 6, further comprising:
a plurality of discharge fins that extend from an outside surface of the casing at a location which is overlapped with a projected surface of the first stacked body and a projected surface of the second stacked body on the casing.

10. The electric power source device according to claim 7, wherein
the plurality of discharge fins are arranged parallel from each other in a direction along which the first stacked body and the second stacked body are arranged.

11. The electric power source device according to claim 8, wherein
the plurality of discharge fins are arranged parallel from each other in a direction along which the first stacked body and the second stacked body are arranged.

12. The electric power source device according to claim 9, wherein
the plurality of discharge fins are arranged parallel from each other in a direction along which the first stacked body and the second stacked body are arranged.

* * * * *